(12) United States Patent
Cable

(10) Patent No.: US 9,537,245 B1
(45) Date of Patent: Jan. 3, 2017

(54) METER CENTER, AND SOCKET ASSEMBLY AND METHOD OF ASSEMBLING A SOCKET ASSEMBLY THEREFOR

(71) Applicant: EATON CORPORATION, Cleveland, OH (US)

(72) Inventor: Albert Boyd Cable, Springfield, IL (US)

(73) Assignee: EATON CORPORATION, Cleveland, OH (US)

( * ) Notice: Subject to any disclaimer, the term of this patent is extended or adjusted under 35 U.S.C. 154(b) by 0 days.

(21) Appl. No.: 14/944,734

(22) Filed: Nov. 18, 2015

(51) Int. Cl.
*H01R 33/945* (2006.01)
*H01R 13/434* (2006.01)
*H01R 43/20* (2006.01)
*H01R 25/16* (2006.01)

(52) U.S. Cl.
CPC .......... *H01R 13/434* (2013.01); *H01R 25/162* (2013.01); *H01R 43/20* (2013.01)

(58) Field of Classification Search
CPC .......... H01R 33/94; H01R 29/00; H01R 31/08
USPC ................................ 439/517, 508, 167, 146
See application file for complete search history.

(56) References Cited

U.S. PATENT DOCUMENTS

| | | | |
|---|---|---|---|
| 4,201,439 A * | 5/1980 | M'Sadoques | ........ H01R 13/113 439/839 |
| 5,951,324 A | 9/1999 | Campbell | |
| 5,980,311 A | 11/1999 | Campbell et al. | |
| 5,982,611 A | 11/1999 | Campbell et al. | |
| 6,012,937 A | 1/2000 | Campbell et al. | |
| 6,015,314 A | 1/2000 | Benfante | |
| 6,561,304 B1 * | 5/2003 | Henry | .................. B60G 15/063 180/402 |
| 6,561,844 B1 | 5/2003 | Johnson | |
| 6,793,542 B1 | 9/2004 | White | |
| 6,945,813 B1 * | 9/2005 | Kellerman | ........... H01R 13/193 439/508 |
| 7,239,502 B1 | 7/2007 | Seff et al. | |
| 7,522,406 B2 | 4/2009 | Seff et al. | |
| 2002/0182930 A1 * | 12/2002 | Seff | ........................ H01R 11/26 439/504 |
| 2003/0092312 A1 | 5/2003 | Johnson | |
| 2005/0202715 A1 * | 9/2005 | Kellerman | ........... H01R 13/193 439/517 |

* cited by examiner

*Primary Examiner* — Phuongchi T Nguyen

(74) *Attorney, Agent, or Firm* — Eckert Seamans; John Powers; Grant Coffield

(57) ABSTRACT

A socket assembly is for a meter center including at least one meter having a stab. The socket assembly includes a base member; and a jaw assembly having a first jaw member and a second jaw member coupled to the first jaw member, each of the first jaw member and the second jaw member having a number of retaining edges and being structured to engage the stab. The jaw assembly is structured to rotate between a first position corresponding to disengagement between the number of retaining edges and the base member, and a second position corresponding to engagement between the number of retaining edges and the base member.

18 Claims, 6 Drawing Sheets

METER CENTER, AND SOCKET ASSEMBLY AND METHOD OF ASSEMBLING A SOCKET ASSEMBLY THEREFOR

BACKGROUND

Field

The disclosed concept relates generally to meter centers. The disclosed concept also relates to socket assemblies for meter centers. The disclosed concept further relates to methods of assembling socket assemblies for meter centers.

Background

Meter centers including a number of watt-hour meters are commonly used for metering electric power delivered to the tenant(s) of a residence (e.g., without limitation, a single family home; an apartment building) or commercial site (e.g., without limitation, an office complex).

A typical electrical meter center 1 is illustrated in FIG. 1. The meter center 1 includes a cabinet 3 having a plurality of meter socket assemblies 5 (only one is shown in FIG. 1) and a plurality of meters 11. Each socket assembly 5 includes a base member 7, to which various components of the socket assembly 5 are secured. Electrical power is supplied to the meter center 1 by a number of feeder buses 9. The feeder buses 9, which typically consist of three phase buses and a neutral that are electrically connected to the utility lines (not shown), extend horizontally from the cabinet 3, as shown in FIG. 1. A pair of vertical supply buses (not shown) is electrically connected to the feeder buses 9 within the cabinet 3. Each socket assembly 5 mounts a corresponding one of the meters 11 for each tenant circuit and electrically connects the meter 11 to the feeder buses 9 and the supply buses (not shown). Typically, the electrical connections between the meter 11 and the socket assembly 5 are made by plug-in jaws 17 of the socket assembly 5, which engage corresponding stabs 19 of the meter 11. The use of the plug-in jaws 17 within the socket assembly 5, and corresponding stabs 19 on the back of the meter 11, permits the meter 11 to be removed from the socket assembly 5 when servicing the meter 11 is desired.

A significant problem with known socket assemblies is that the plug-in jaws are often dislodged from the respective base members during use. More specifically, installation and/or removal of the meters often results in the jaws being pushed or pulled through the base members. A known approach to address this problem includes incorporating separate fasteners to secure the jaws to the base member. However, this approach is labor intensive and is difficult to automate. Another approach is to include small projections in the base member which extend into corresponding openings in the jaws in order to secure the jaws to the base members. A significant drawback of this approach is that the projections are often sheared off of the base member when the meters are installed and/or removed.

There is thus room for improvement in meter centers, and in socket assemblies and methods of assembling socket assemblies therefor.

SUMMARY

These needs and others are met by the embodiments of the disclosed concept, which are directed to a meter center, and socket assembly and method of assembling a socket assembly therefor in which a jaw assembly is structured to rotate with respect to a base member.

In accordance with one aspect of the disclosed concept, a socket assembly for a meter center including at least one meter having a stab is provided. The socket assembly comprises a base member; and a jaw assembly comprising a first jaw member and a second jaw member coupled to the first jaw member, each of the first jaw member and the second jaw member having a number of retaining edges and being structured to engage the stab. The jaw assembly is structured to rotate between a first position corresponding to disengagement between the number of retaining edges and the base member, and a second position corresponding to engagement between the number of retaining edges and the base member.

As another aspect of the disclosed concept, a meter center comprises a meter comprising a stab; and a socket assembly enclosed by the meter compartment, the socket assembly comprising a base member, and a jaw assembly comprising a first jaw member and a second jaw member coupled to the first jaw member, each of the first jaw member and the second jaw member having a number of retaining edges and being structured to engage the stab. The jaw assembly is structured to rotate between a first position corresponding to disengagement between the number of retaining edges and the base member, and a second position corresponding to engagement between the number of retaining edges and the base member.

As another aspect of the disclosed concept, a method of assembling a socket assembly is provided. The socket assembly is for a meter center including at least one meter having a stab. The socket assembly has a base member and a jaw assembly. The jaw assembly includes a first jaw member and a second jaw member coupled to the first jaw member. Each of the first jaw member and the second jaw member have a number of retaining edges and are structured to engage the stab. The method comprises the steps of inserting the jaw assembly into a thru hole of the base member such that the number of retaining edges do not engage the base member; and rotating the jaw assembly with respect to the base member such that the number of retaining edges move into engagement with the base member, thereby preventing longitudinal movement of the first jaw member and the second jaw member with respect to the base member.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

As employed herein, the term "number" shall mean one or an integer greater than one (i.e., a plurality).

As employed herein, the statement that two or more parts are "connected" or "coupled" together shall mean that the parts are joined together either directly or joined through one or more intermediate parts.

As employed herein, the statement that two or more parts or components "engage" one another shall mean that the parts exert a force against one another either directly or through one or more intermediate parts or components.

Figure 1:
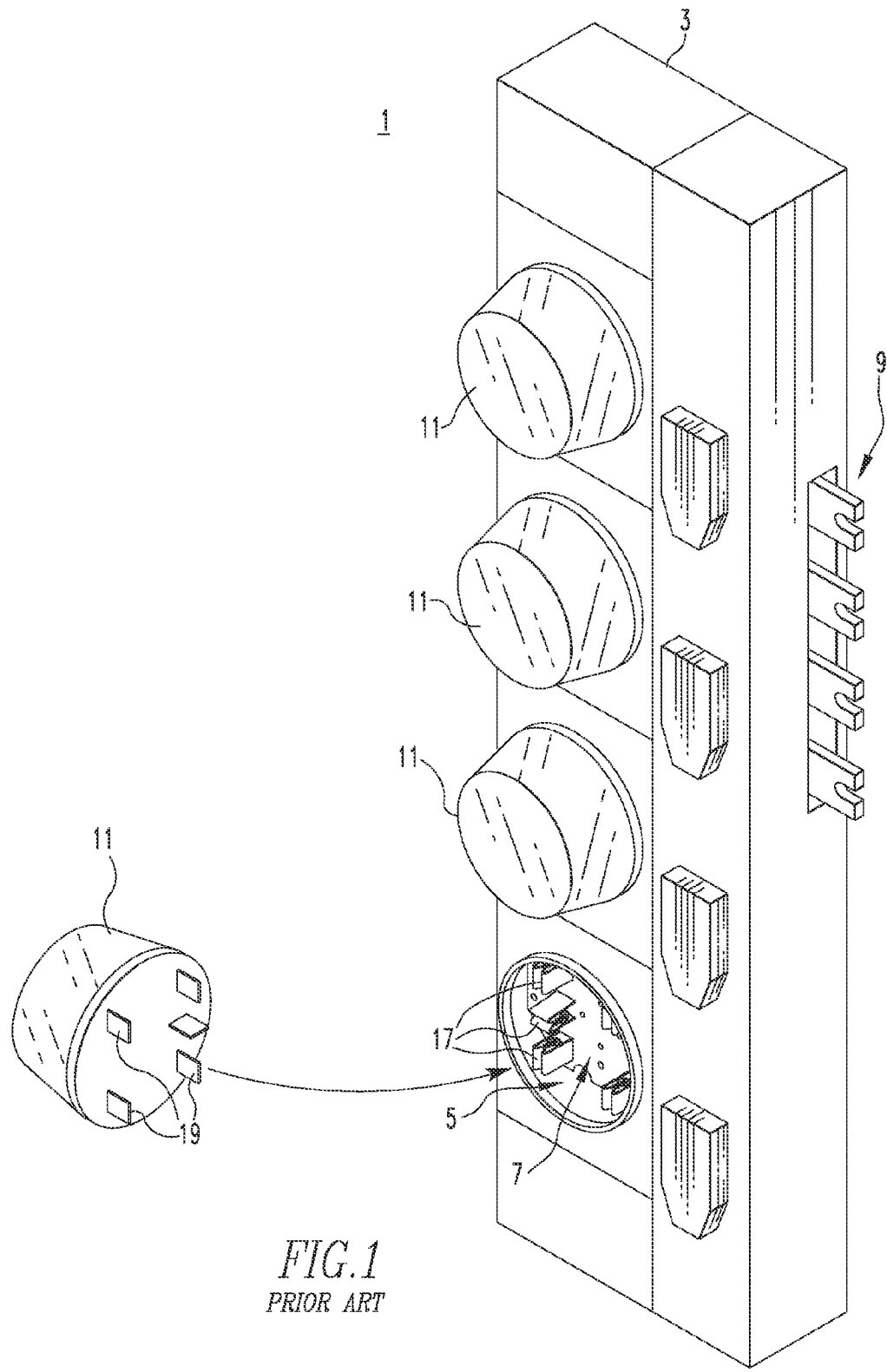
FIG. 1 is a partially exploded front isometric view of a prior art meter center.
Figure 2:
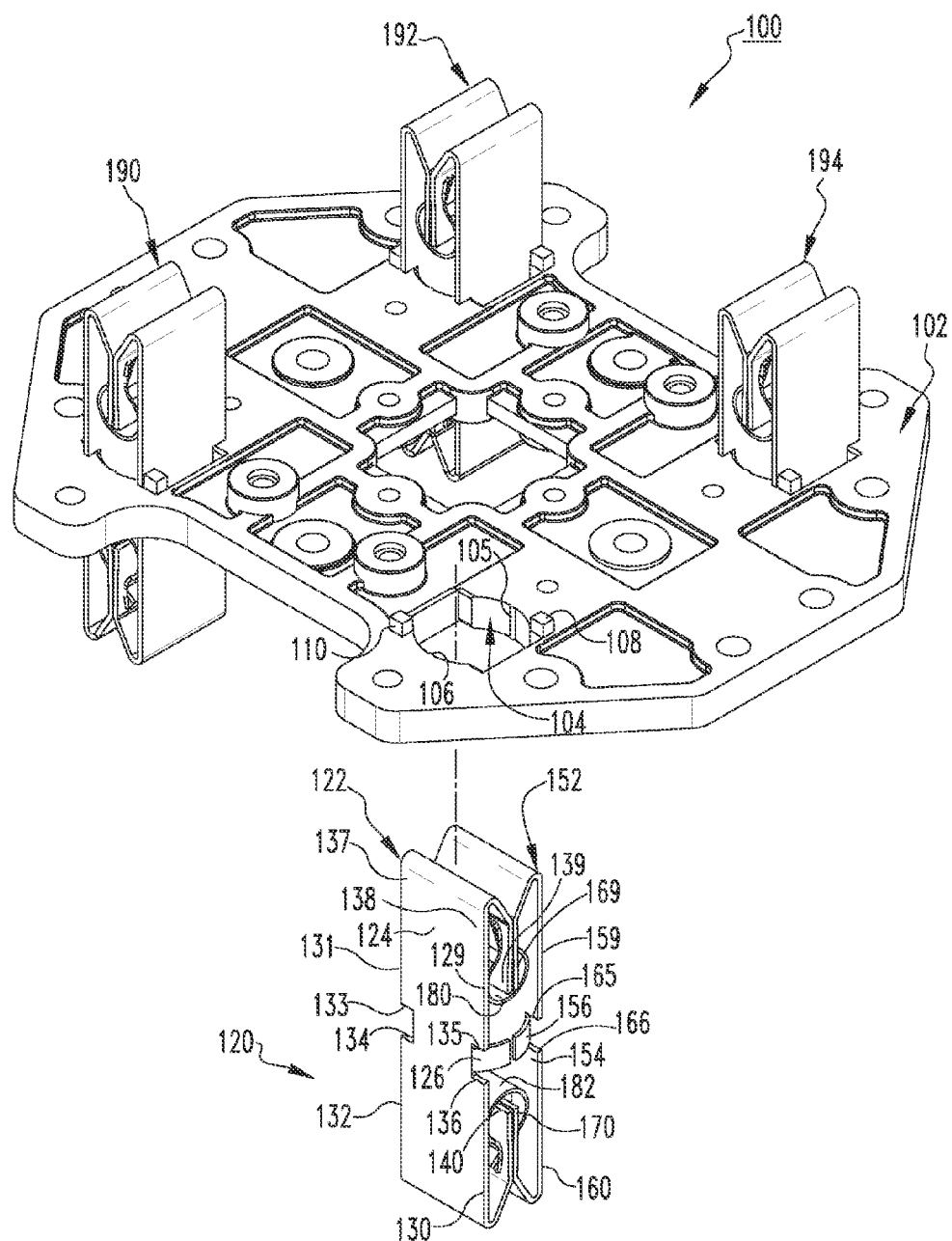
FIG. 2 is a partially exploded front isometric view of a socket assembly for a meter center, in accordance with a non-limiting embodiment of the disclosed concept.

FIG. 2 shows a partially exploded view of a socket assembly 100 for a meter center, in accordance with a non-limiting embodiment of the disclosed concept. The example socket assembly 100 includes a base member 102 and a number of jaw assemblies 120,190,192,194 structured to be coupled to the base member 102. For ease of illustration and economy of disclosure, only the jaw assembly 120 will be discussed in detail herein, although it will be appreciated that the jaw assemblies 190,192,194 are substantially the same as the jaw assembly 120, and are structured to be coupled to the base member 102 in substantially the same manner as the jaw assembly 120. As will be discussed in greater detail hereinbelow, the jaw assembly 120 is structured to be coupled to the base member 102 by a twist-lock mechanism in order to prevent longitudinal and rotational movement of the jaw assembly 120 with respect to the base member 102. Among other benefits, this novel coupling mechanism advantageously ensures that during installation and/or removal of electrical apparatus (e.g., without limitation, electrical meters in meter centers (not shown)), the jaw assembly 120 is not pushed or pulled through the base member 102. Additionally, the coupling mechanism advantageously allows the socket assembly 100 to be manufactured using relatively simple automation processes.

Figure 5:
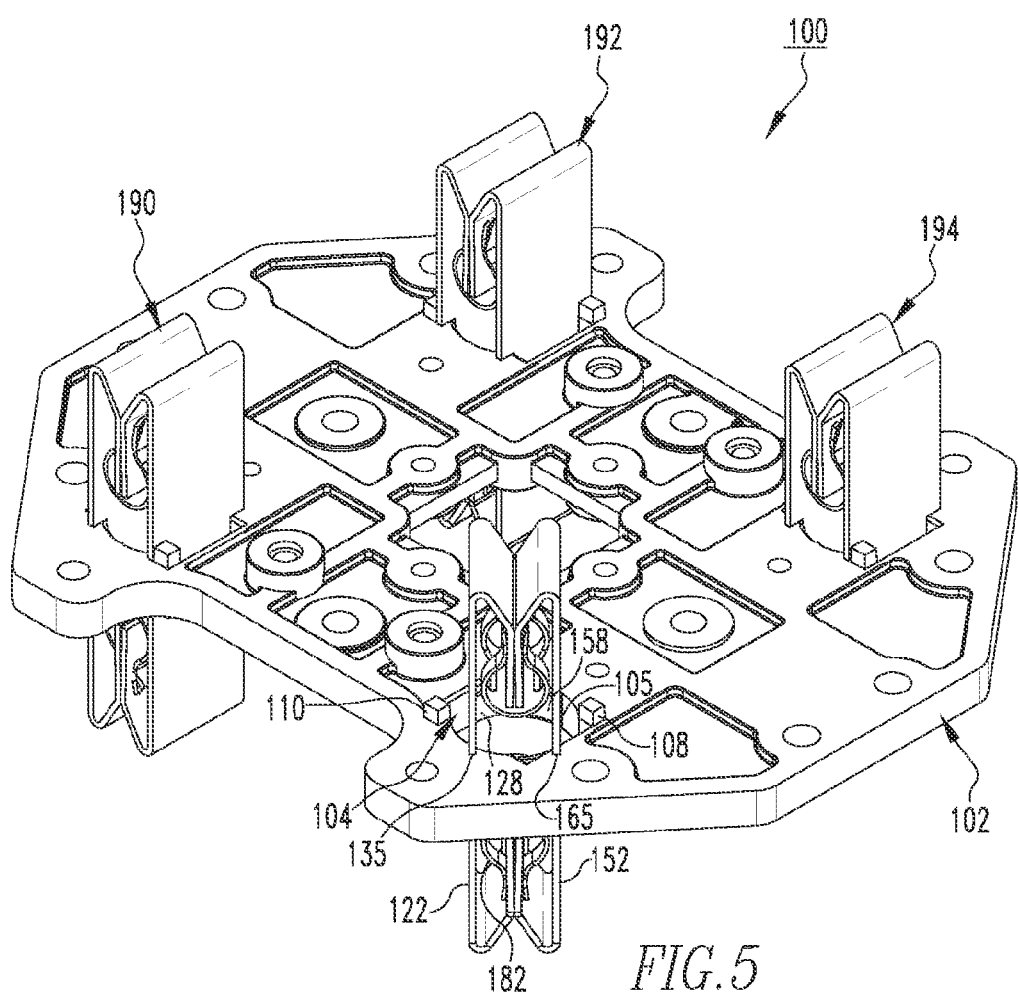
FIG. 5 is a front isometric view of the socket assembly of FIG. 4, shown with the same jaw assembly partially rotated.

The jaw assembly 120 includes a pair of symmetric and identical jaw members 122,152 that are coupled to each other and are each structured to engage a conductive member (not shown), such as a stab of an electrical meter. For ease of illustration and economy of disclosure, only a portion of the jaw member 152 will be referenced in detail herein. The jaw members 122,152 each include a respective body portion 124,154 and a respective number of opposing tab portions 126,128 (FIG. 5),156,158 (FIG. 5). The tab portions 126,128,156,158 are structured to prevent rotational movement of the jaw assembly 120 with respect to the base member, and the body portions 124,154 are structured to prevent longitudinal movement as well as assist in preventing rotational movement of the jaw assembly 120 with respect to the base member 102, as will be discussed below.

In the non-limiting example shown and described, the body portions 124,154 each have a respective number of pairs of spaced apart and collinear external edges 129,130, 131,132,159,160, a respective number of retaining edges 133,134,135, 136,165,166 extending inwardly from the external edges 129,130,131,132,159,160 toward each other, a pair of opposing side portions 137,138,167 (FIG. 6),168 (FIG. 6), and a pair of opposing end portions 139,140,169, 170. In the exemplary embodiment, the tab portions 126, 128,156,158 extend from the respective retaining edges 133,134,135,136,165,166 toward each other and are each located between a corresponding pair of opposing retaining edges 133,134,135,136,165,166. Additionally, the jaw assembly 120 includes a pair of biasing elements (e.g., without limitation, springs 180,182) that bias the respective end portions 139,140,169,170 toward engagement with each other in order to allow a suitable electrical connection to be made with conductive stabs (not shown) of an electrical apparatus such as, for example, an electrical meter (not shown). Continuing to refer to FIG. 2, the base member 102 includes a receiving portion 104 defining a thru hole for receiving the jaw assembly 120, and a number of external blocking portions 108,110. The receiving portion 104 also has a number of internal blocking portions 105,106 that are generally projections extending inwardly from a surface of the receiving portion 104.

Figure 3:
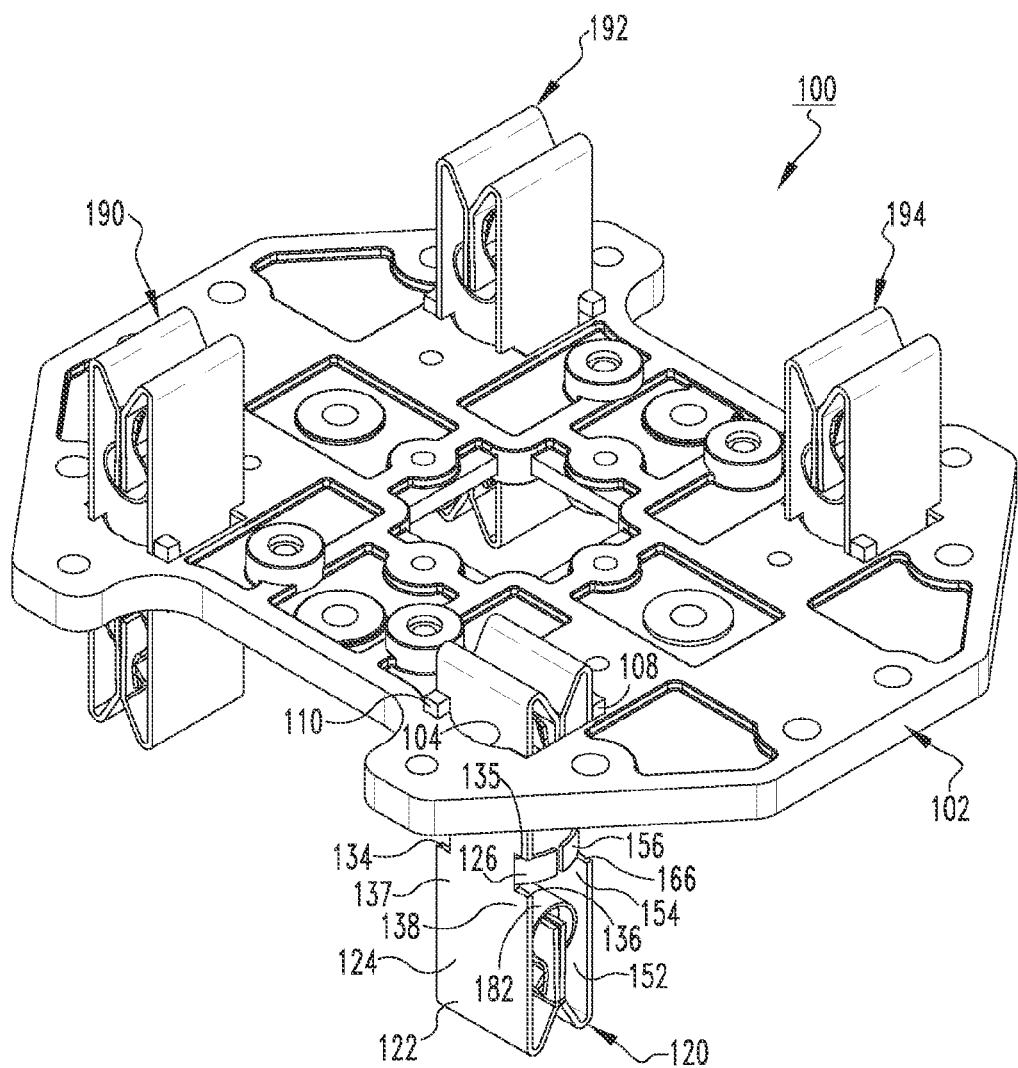
FIG. 3 is front isometric view of the socket assembly of FIG. 2, shown with three jaw assemblies fully installed in a base member, and one jaw assembly partially installed in the base member.
Figure 4:
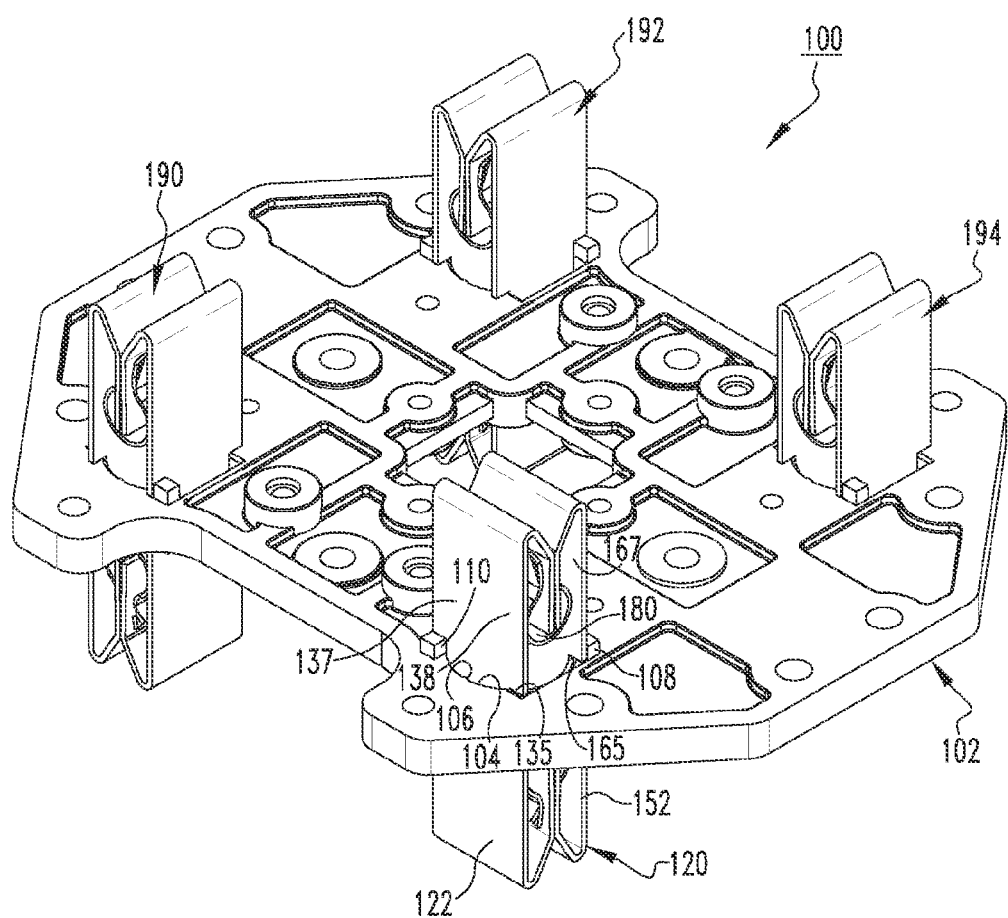
FIG. 4 is a front isometric view of the socket assembly of FIG. 3, shown with one jaw assembly in a first position, before being rotated.

FIG. 3 shows the socket assembly 100 with the jaw assembly 120 partially inserted into the receiving portion 104, and FIG. 4 shows the socket assembly 100 with the jaw assembly 120 fully inserted into the receiving portion 104. When the jaw assembly 120 is in the first position shown in FIG. 4, the retaining edges 133,134,135,136,165,166 (partially shown in FIG. 4) do not engage the base member 102, and the base member 102 is not located between any respective pair of opposing retaining edges 133,134,135, 136,165,166. That is, in the first position shown in FIG. 4, the jaw assembly 120 is not maintained on (i.e., not prevented from easily being pushed or pulled through) the base member 102, or not prevented from moving longitudinally with respect to the base member 102.

Figure 6:
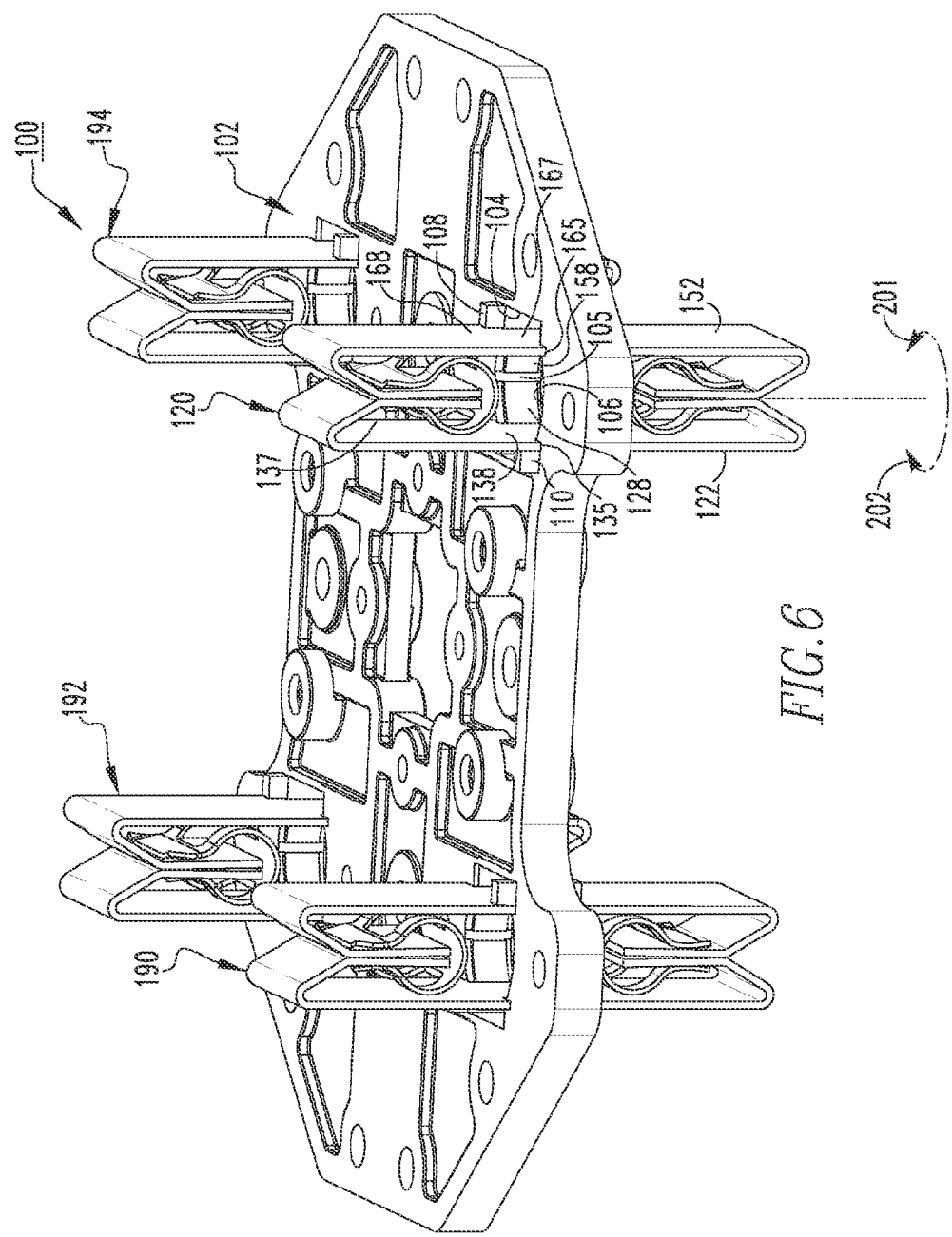
FIG. 6 is a front isometric view of the socket assembly of FIG. 5, shown with the same jaw assembly fully rotated to a second, installed position.

In order to couple the jaw assembly 120 to the base member 102 and thus provide a relatively secure structure for electrical apparatus (not shown) to engage, the jaw assembly 120 is structured to twist, or rotate (in the directions of arrows 201,202 in FIG. 6) with respect to the base member 102 and move from the first position (FIG. 4) to a second position, shown in FIG. 6. FIG. 5 shows the jaw assembly 120 in a third position that is between the first position (FIG. 4) and the second position (FIG. 6). The third position (FIG. 5) corresponds to the jaw assembly 120 being partially rotated, and the second position (FIG. 6) corresponds to the jaw assembly 120 being fully rotated to a secured position. In the exemplary embodiment, the jaw assembly 120 rotates approximately ninety degrees with respect to the base member 102 when moving from the first position (FIG. 4) to the second position (FIG. 6). However, it will be appreciated that any suitable alternative angle of rotation may be employed in order to perform the desired coupling function, without departing from the scope of the disclosed concept.

When the jaw assembly 120 moves from the first position (FIG. 4) toward the second position (FIG. 6), the retaining edges 133,134,135,136,165,166 (partially shown in FIGS. 4-6) move into engagement with and overlay the base member 102 in order to prevent longitudinal movement of the jaw members 122,152 with respect to the base member 102. More specifically, when the jaw assembly 120 is in the third position (FIG. 5) and the second position (FIG. 6), the base member 102 is located between each corresponding opposing pair of the retaining edges 133,134,135,136,165, 166. In this manner, the retaining edges 133,134,135,136, 165, 166 advantageously provide a relatively secure mechanism to longitudinally secure the jaw assembly 120 to the base member 102. That is, there are four locations that ensure that the jaw assembly 120 is not able to be inadvertently pulled through the base member 102.

In other words, an attempt to push or pull the jaw assembly 120 through the thru hole of the receiving portion 104 when the jaw assembly 120 is in the second position (FIG. 6) would result in four respective retaining edges, either the retaining edges 133,135,165 (and the other opposing retaining edge of the jaw member 152) or the retaining edges 134,136,166 (and the other opposing retaining edge of the jaw member 152), acting in concert to oppose the motion by causing the base member 102 to exert a normal force on the jaw members 122,152 in a direction opposite the direction of the attempted motion. As a result of the relatively strong forces between the base member 102 and the retaining edges 133,134,135,136,165, 166, the likelihood that installation and removal of electrical apparatus such as electrical meters (not shown) will cause the jaw assembly 120 to be pushed or pulled through the base member 102 is significantly small. Additionally, although the disclosed concept is being described in association with the eight retaining edges 133,134,135,136,165,166 (and the other respective retaining edges of the jaw members 122,152), it will be appreciated that a similar suitable alternative jaw assembly (not shown) may have any suitable alternative number of retaining edges and/or construction of jaw members (e.g., not being identical) in order to perform the desired function of preventing longitudinal movement though the base member 102.

Additionally, the socket assembly 100 also has a mechanism to prevent rotational movement of the jaw assembly 120 with respect to the base member 102 when the jaw assembly 120 is in the second, installed position (FIG. 6). More specifically, when the jaw assembly 120 is in the first position (FIG. 4) and the third position (FIG. 5), the blocking portion 105 is not located between the tab portions 128,158, and the blocking portion 106 is not located between the tab portions 126,156 (FIG. 2). As shown in FIG. 6, when the jaw assembly 120 is in the second position, the blocking portion 105 is located between the tab portions 128,158 (i.e., directly between and separating distal ends of the respective tab portions 128,158). It will similarly be appreciated that in the second position (FIG. 6), the blocking portion 106 is located between the tab portions 126,156 (FIG. 2).

When the jaw assembly 120 moves from the first position to the second position, the tab portions 126 (FIG. 2),158 initially flex (i.e., deflect) inwardly toward each other as they are twisted over the respective blocking portions 105,106. However, at the instant the jaw assembly 120 is twisted to the second position, the tab portions 126 (FIG. 2),158 flex outwardly away from each other and return to the position in which they are not deflected in order to allow the respective blocking portions 105,106 to be located between the respective tab portions 126 (FIG. 2),128,156 (FIG. 2),158 and resist rotation of the jaw assembly 120 with respect to the base member 102. In the second position, the interaction of, or engagement between, the blocking portions 105,106 and the tab portions 126,128,156, 158 prevents rotational movement of the jaw members 122,152 with respect to the base member 102. Specifically, an attempted rotation of the jaw assembly 120 in a first direction 201 (counterclockwise in the orientation of FIG. 6) would result in the tab portions 126,158 pressing into and engaging the respective blocking portions 105,106. The normal force exerted by the respective blocking portions 105,106 on the respective tab portions 126,158 would prevent any undesired rotation. Similarly, an attempted rotation of the jaw assembly in a second direction 202 (clockwise in the orientation of FIG. 6) opposite the first direction 201 would result in the other tab portions 128,156 engaging and pressing into the respective blocking portions 105,106. It follows that the normal force exerted by the respective blocking portions 105,106 on the respective tab portions 128,156 would prevent any undesired rotation.

In addition to employing the internal blocking portions 105,106 with the respective tab portions 126,128,156,158, the external blocking portions 108,110 further assist in preventing undesired rotation of the jaw assembly 120 with respect to the base member 102. More specifically, when the jaw assembly 120 is in the first position (FIG. 4), the first side portions 137,167 engage the respective blocking portions 108,110 and the second side portions 138,168 do not engage the respective blocking portions 110. When the jaw assembly 120 moves toward the second position (FIG. 6), the first side portions 137,167 disengage the respective blocking portions 108,110 and the second side portions 138,168 move, or rotate, toward the respective blocking portions 108,110 until the second side portions 138,168 actually move into engagement with the respective blocking portions 108,110 (see FIG. 6). It will be appreciated that an attempted rotation of the jaw assembly 120 in the second direction 202 would result in the second side portions 138,168 pressing into the respective blocking portions 108, 110. As a result, the normal force exerted by the blocking portions 108,110 on the respective second side portions 138,168 advantageously operates to further prevent undesired rotation of the jaw assembly 120 with respect to the base member 102. It will, however, be appreciated that suitable alternative mechanisms may be employed to prevent undesired rotation without departing from the scope of the disclosed concept.

The retaining edges 133,134,135,136,165,166 and the tab portions 126,128,156,158 thus advantageously cooperatively secure the jaw members 122,152 to the base member 102 without a separate fastener when the jaw assembly 120 is in the second position (FIG. 6). In this manner, automation of the socket assembly 100 is relatively simple in that an insertion and rotation of the jaw assemblies 120,190, 192, 194 into and with respect to the base member 102 is all that is required to reliably couple the jaw assemblies 120,190, 192,194 to the base member 102. This is distinct from some known socket assemblies (not shown) which require more burdensome methods of assembly such as, for example, drilling holes and manually inserting separate fasteners to secure jaw assemblies to base members.

It will be appreciated that a method of assembling the socket assembly 100 includes the steps of inserting the jaw assembly 120 into the thru hole of the base member 102 such that the retaining edges 133,134,135,136,165,166 do not engage the base member 102; and rotating the jaw assembly 120 with respect to the base member 102 such that the retaining edges 133,134,135,136,165,166 move into engagement with the base member 102, thereby preventing longitudinal movement of the first jaw member 122 and the second jaw member 152 with respect to the base member 102. The rotating step further includes the steps of moving the first side portions 137,167 out of engagement with the respective blocking portions 108,110; and moving the second side portions 138,168 into engagement with the respective blocking portions 108,110 in order to prevent rotation of the jaw members 122,152 in a direction 202 with respect to the base member 102. The rotating step also includes rotating the jaw assembly 120 ninety degrees with respect to the base member 102 until the second side portions 138,168 move into engagement with the respective blocking portions 108,110. The rotating step further includes rotating the jaw assembly 120 until the internal blocking portions 105,106 are located between the respective tab portions 126,128,156, 158, thereby preventing rotational movement of the jaw members 122,152 with respect to the base member 102.

Accordingly, it will be appreciated that the disclosed concept provides for an improved (e.g., without limitation, better maintained, easier to automate) meter center, and socket assembly 100 and method of assembling a socket assembly 100 therefor, in which a number of jaw assemblies 120,190,192,194 are structured to rotate with respect to a base member 102 in order to quickly and reliably secure the jaw assemblies 120,190,192,194 to the base member 102 in such a way that undesirable longitudinal and rotational movement of the jaw assemblies 120,190,192,194 with respect to the base member 102 is advantageously prevented.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A socket assembly for a meter center including at least one meter having a stab, said socket assembly comprising:
a base member; and
a jaw assembly comprising a first jaw member and a second jaw member coupled to said first jaw member, each of said first jaw member and said second jaw member having a number of retaining edges and being structured to engage said stab,
wherein said jaw assembly is structured to rotate between a first position corresponding to disengagement between said number of retaining edges and said base member, and a second position corresponding to engagement between said number of retaining edges and said base member;
wherein each of said first jaw member and said second jaw member comprises a body portions and a number of tab portions extending from said body portion of said first jaw member and said second jaw member toward each other; wherein said body portion has said number of retaining edges and
wherein, when said jaw assembly is in the second position, said number of tab portions engage said base member in order to prevent rotational movement of said first jaw member and said second jaw member with respect to said base member.

2. The socket assembly of claim 1 wherein, when said jaw assembly is in the second position, said number of retaining edges and said number of tab portions cooperatively secure said first jaw member and said second jaw member to said base member without a separate fastener.

3. The socket assembly of claim 1 wherein, said number of tab portions of said first jaw member comprises a first tab portion and a second tab portion disposed opposite said first tab portion; wherein said number of tab portions of said second jaw member comprises a third tab portion and a fourth tab portion disposed opposite said third tab portion; wherein said base member comprises a receiving portion having a first internal blocking portion and a second internal blocking portion; wherein, when
said jaw assembly is in the second position, said first internal blocking portion is disposed between said first tab portion and said third tab portion; and wherein, when said jaw assembly is in the second position, said second internal blocking portion is disposed between said second tab portion and said fourth tab portion.

4. The socket assembly of claim 1 wherein, said number of tab portions of said first jaw member comprises a first tab portion and a second tab portion disposed opposite said first tab portion; wherein said number of tab portions of said second jaw member comprises a third tab portion and a fourth tab portion disposed opposite said third tab portion; wherein said first tab portion extends from said body portion of said first jaw member toward said third tab portion; and wherein said second tab portion of said body portion of said first jaw member extends toward said fourth tab portion.

5. The socket assembly of claim 1 wherein, said number of tab portions of said first jaw member comprises a first tab portion; wherein said number of tab portions of said second jaw member comprises a second tab portion; wherein, when said jaw assembly moves from the first position toward the second position,
said first tab portion and said second third tab portion deflect inwardly toward each other; and wherein, when said jaw assembly is in the second position, said first tab portion and said second tab portion are not deflected in order to resist rotation of said jaw assembly with respect to said base member.

6. The socket assembly of claim 1 wherein, when said jaw assembly is in the second position, said number of retaining edges prevent longitudinal movement of said first jaw member and said second jaw member with respect to said base member.

7. The socket assembly of claim 1 wherein said jaw assembly further comprises a first biasing element and a second biasing element; wherein said first jaw member comprises a first end portion and a second end portion disposed opposite the first end portion; wherein said second jaw member comprises a third end portion and a fourth end portion disposed opposite the third end portion; wherein said first biasing element biases the first end portion toward engagement with the third end portion; and wherein said second biasing element biases the second end portion toward engagement with the fourth end portion.

8. The socket assembly of claim 1 wherein said base member comprises a blocking portion; wherein said first jaw member comprises a first side portion and a second side portion disposed opposite said first side portion; wherein, when said jaw assembly is in the first position, said first side portion engages said blocking portion and said second side portion does not engage said blocking portion; wherein, when said jaw assembly moves from the first position to the second position, said first side portion disengages said blocking portion and said second side portion engages said blocking portion in order to prevent rotation of said first jaw member in a direction with respect to said base member.

9. The socket assembly of claim 8 wherein said base member further comprises a second blocking portion; wherein said second jaw member comprises a third side portion and a fourth side portion disposed opposite said third side portion; wherein, when said jaw assembly is in the first position, said third side portion engages said second blocking portion and said fourth side portion does not engage said second blocking portion; wherein, when said jaw assembly moves from the first position to the second position, said third side portion disengages said second blocking portion and said fourth side portion engages said second blocking portion in order to prevent rotation of said first jaw member in the direction with respect to said base member.

10. The socket assembly of claim 1 wherein at least one of said first jaw member and said second jaw member further has a first external edge, a second external edge spaced from and being collinear with said first external edge, a third external edge disposed opposite said first external edge, and a fourth external edge spaced from and being collinear with said third external edge; wherein said number of retaining edges of said at least one of said first jaw member and said second jaw member comprises a first retaining edge extending inwardly from said first external edge, a second retaining edge extending inwardly from said second external edge, a third retaining edge extending inwardly from said third external edge toward said first retaining edge, and a fourth retaining edge extending inwardly from said fourth external edge toward said fourth retaining edge.

11. The socket assembly of claim 10 wherein, when said jaw assembly is in the first position, said base member is not disposed between said first retaining edge and said second retaining edge; wherein, when said jaw assembly is in the first position, said base member is not disposed between said third retaining edge and said fourth retaining edge; wherein, when said jaw assembly is in the second position, said base member is disposed between said first retaining edge and said second retaining edge; and wherein, when said jaw assembly is in the second position, said base member is disposed between said third retaining edge and said fourth retaining edge.

12. The socket assembly of claim 10 wherein said at least one of said first jaw member and said second jaw member further has a first tab portion and a second tab portion; wherein said first tab portion extends from said first retaining edge and said second retaining edge and is disposed therebetween; and wherein said second tab portion extends from said third retaining edge and said fourth retaining edge and is disposed therebetween.

13. The socket assembly of claim 12 wherein said at least one of said first jaw member and said second jaw member is said first jaw member and said second jaw member; wherein said first tab portion of said first jaw member extends from said respective first retaining edge and said respective second retaining edge toward said first tab portion of said second jaw member; and wherein said second tab portion of said first jaw member extends from said respective third retaining edge and said respective fourth retaining edge toward said second tab portion of said second jaw member.

14. A meter center comprising:
a meter comprising a stab; and
a socket assembly enclosed by said meter compartment, said socket assembly comprising:
  a base member, and a jaw assembly comprising a first jaw member and a second jaw member coupled to said first jaw member, each of said first jaw member and said second jaw member having a number of retaining edges and being structured to engage said stab,
  wherein said jaw assembly is structured to rotate between a first position corresponding to disengagement between said number of retaining edges and said base member, and a second position corresponding to engagement between said number of retaining edges and said base member;
  wherein each of said first jaw member and said second jaw member comprises a body portions and a number of tab portions extending from said body portion of said first jaw member and said second jaw member toward each other; wherein said body portion has said number of retaining edges and
  wherein, when said jaw assembly is in the second position, said number of tab portions engage said base member in order to prevent rotational movement of said first jaw member and said second jaw member with respect to said base member.

15. A method of assembling a socket assembly for a meter center including at least one meter having a stab, said socket assembly comprising a base member and a jaw assembly, said jaw assembly comprising a first jaw member and a second jaw member coupled to said first jaw member, each of said first jaw member and said second jaw member having a number of retaining edges and being structured to engage said stab,
the method comprising the steps of:
inserting said jaw assembly into a thru hole of said base member such that said number of retaining edges do not engage said base member; and
rotating said jaw assembly with respect to said base member such that said number of retaining edges move into engagement with said base member, thereby preventing longitudinal movement of said first jaw member and said second jaw member with respect to said base member;
wherein said base member comprises a blocking portion; wherein at least one of said first jaw member and said second jaw member comprises a first side portion and a second side portion disposed opposite said first side portion, the first side portion of the first jaw member extending toward the second side portion of the second jaw member and versa;
wherein the rotating step comprises:
  moving said first side portion out of engagement with said blocking portion; and
  moving said second side portion into engagement with said blocking portion in order to prevent rotation of said at least one of said first jaw member and said second jaw member in a direction with respect to said base member.

16. The method of claim 15 wherein the rotating step further comprises: rotating said jaw assembly ninety degrees with respect to said base member until said second side portion moves into engagement with said blocking portion.

17. The method of claim 15 wherein said base member comprises a receiving portion defining the thru hole; wherein said receiving portion has a blocking portion; wherein each of said first jaw member and said second jaw member comprises a body portion and a tab portion extending from said body portion; and wherein the rotating step further comprises:
rotating said jaw assembly until said blocking portion is disposed between said tab portion of said first jaw member and said tab portion of said second jaw member, thereby preventing rotational movement of said first jaw member and said second jaw member with respect to said base member.

18. The method of claim 17 wherein said base member further comprises a second blocking portion; wherein said first jaw member comprises a first side portion and a second side portion disposed opposite said first side portion; and wherein the rotating step comprises:
moving said first side portion out of engagement with said second blocking portion; and
moving said second side portion into engagement with said second blocking portion.

* * * * *